United States Patent
Kanegae

(10) Patent No.: US 10,811,631 B2
(45) Date of Patent: Oct. 20, 2020

(54) THIN FILM TRANSISTOR ELEMENT SUBSTRATE, METHOD OF PRODUCING THE SUBSTRATE, AND ORGANIC EL DISPLAY DEVICE INCLUDING THE THIN FILM TRANSISTOR ELEMENT SUBSTRATE

(71) Applicant: PANASONIC CORPORATION, Osaka (JP)

(72) Inventor: Arinobu Kanegae, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/227,738

(22) Filed: Dec. 20, 2018

(65) Prior Publication Data

US 2019/0123300 A1 Apr. 25, 2019

Related U.S. Application Data

(63) Continuation of application No. 14/636,812, filed on Mar. 3, 2015, now Pat. No. 10,199,601.

(30) Foreign Application Priority Data

Mar. 17, 2014 (JP) .................. 2014-053233

(51) Int. Cl.
*H01L 51/52* (2006.01)
*H01L 29/66* (2006.01)
(Continued)

(52) U.S. Cl.
CPC ...... *H01L 51/5253* (2013.01); *H01L 27/3262* (2013.01); *H01L 29/66969* (2013.01);
(Continued)

(58) Field of Classification Search
CPC ............. H01L 51/5253; H01L 29/7869; H01L 27/3262
See application file for complete search history.

(56) References Cited

U.S. PATENT DOCUMENTS

| 8,039,739 B1 | 10/2011 | Capps et al. |
| 2003/0168966 A1 | 9/2003 | Kobayashi et al. |

(Continued)

FOREIGN PATENT DOCUMENTS

| JP | 2009-278115 A | 11/2009 |
| JP | 2010-258196 A | 11/2010 |

(Continued)

OTHER PUBLICATIONS

Office Action issued in U.S. Appl. No. 14/716,909, dated Apr. 27, 2017.

*Primary Examiner* — Jay C Chang
*Assistant Examiner* — Mikka Liu
(74) *Attorney, Agent, or Firm* — Greenblum & Bernstein, P.L.C.

(57) ABSTRACT

The thin film transistor element substrate of the present disclosure includes a first moisture barrier layer covering the gate insulating layer and the gate electrode, covering the contact regions of the oxide semiconductor layer other than the connecting portion of the contact region connected to the source electrode and the connecting portion of the contact region connected to the drain electrode, and covering an surface of the substrate on which the oxide semiconductor layer is not disposed. The first moisture barrier layer includes a metal oxide and is formed by atomic layer deposition. The first moisture barrier layer formed by atomic layer deposition is in contact with a pair of contact regions.

8 Claims, 9 Drawing Sheets

(51) Int. Cl.
  *H01L 29/786* (2006.01)
  *H01L 51/00* (2006.01)
  *H01L 27/32* (2006.01)

(52) U.S. Cl.
  CPC .... *H01L 29/7869* (2013.01); *H01L 29/78609* (2013.01); *H01L 51/0097* (2013.01); *Y02E 10/549* (2013.01)

(56) References Cited

U.S. PATENT DOCUMENTS

| | | |
|---|---|---|
| 2006/0215069 A1 | 9/2006 | Yamasaki |
| 2009/0283763 A1 | 11/2009 | Park et al. |
| 2010/0089636 A1 | 4/2010 | Ramadas et al. |
| 2010/0178481 A1 | 7/2010 | George et al. |
| 2011/0240998 A1* | 10/2011 | Morosawa ........ H01L 29/41733 257/57 |
| 2012/0049178 A1 | 3/2012 | Sugimoto |
| 2013/0092924 A1 | 4/2013 | Sasagawa |
| 2013/0228775 A1* | 9/2013 | Noda ................. H01L 29/7869 257/43 |
| 2013/0234131 A1 | 9/2013 | Tanaka et al. |
| 2013/0256673 A1 | 10/2013 | Nishiyama |
| 2013/0256798 A1 | 10/2013 | Kinoshita |
| 2013/0267068 A1 | 10/2013 | Hanaoka et al. |
| 2014/0131702 A1* | 5/2014 | Matsubayashi ... H01L 29/78648 257/43 |
| 2014/0159037 A1* | 6/2014 | Kwon ............... H01L 29/78618 257/43 |
| 2014/0346499 A1 | 11/2014 | Kato |
| 2015/0187878 A1* | 7/2015 | Yamazaki ............. H01L 27/124 257/43 |
| 2015/0357589 A1 | 12/2015 | Zhu |
| 2017/0033238 A1 | 2/2017 | Koezuka |
| 2017/0229585 A1 | 8/2017 | Yamazaki et al. |

FOREIGN PATENT DOCUMENTS

| | | |
|---|---|---|
| JP | 2011-228622 A | 11/2011 |
| JP | 2013-025972 A | 2/2013 |
| JP | 2013-110116 A | 6/2013 |
| JP | 2013-175710 A | 9/2013 |
| JP | 2013-211410 A | 10/2013 |
| JP | 2013-214732 A | 10/2013 |
| JP | 2013-232636 A | 11/2013 |

\* cited by examiner

FIG. 2

|  | PROCESS | THICKNESS (nm) | WATER VAPOR TRANSMISSION RATE (g/m²/day) |
|---|---|---|---|
| EXAMPLE | ALD | 40 | $1.0 \times 10^{-4}$ |
| COMPARATIVE EXAMPLE | SPUTTERING | 60 | $1.0 \times 10^{-1}$ |

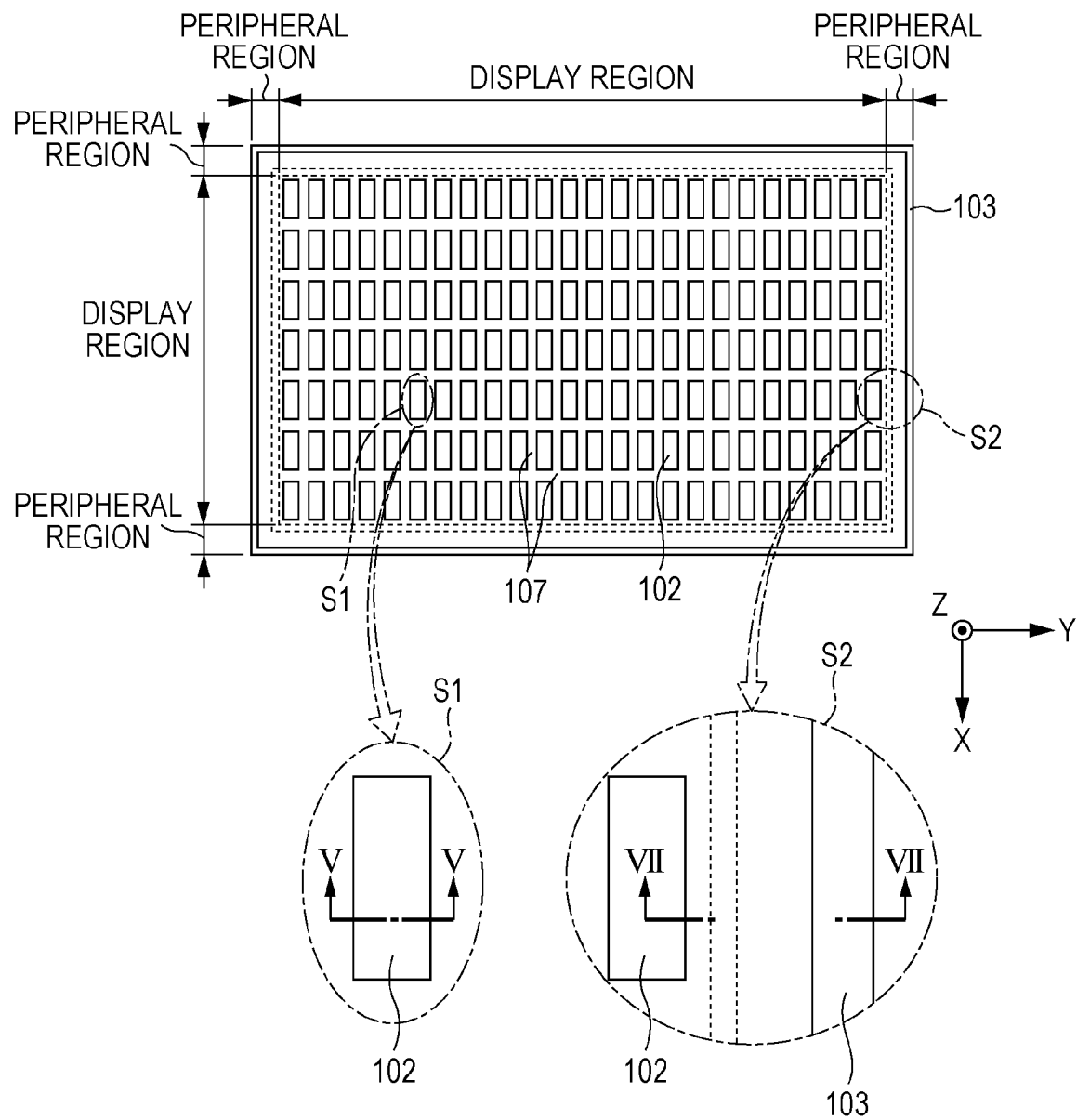

THIN FILM TRANSISTOR ELEMENT SUBSTRATE, METHOD OF PRODUCING THE SUBSTRATE, AND ORGANIC EL DISPLAY DEVICE INCLUDING THE THIN FILM TRANSISTOR ELEMENT SUBSTRATE

This is a continuation application of U.S. application Ser. No. 14/636,812, filed Mar. 3, 2015, which claims the benefit of Japanese Patent Application No. 2014-053233, filed on Mar. 17, 2014. The entire disclosure of each of the above-identified applications, including the specification, drawings, claims and abstract, is incorporated herein by reference in its entirety.

BACKGROUND

1. Technical Field

The present disclosure relates to a thin film transistor element substrate including an oxide semiconductor, a method of producing the substrate, and an organic EL display device including the thin film transistor element substrate.

2. Description of the Related Art

In recent years, thin film transistor element substrates having channel layers made by using oxide semiconductor materials, such as In—Ga—Zn—O, have been being researched and developed actively. Hereinafter, a thin film transistor element substrate may also be referred to as a TFT substrate. The TFT substrate including an oxide semiconductor material generally has a bottom-gate structure, as in conventional TFT substrates using amorphous silicon. However, top-gate type TFT substrates, which have small parasitic capacitances between a gate electrode and a source electrode and between a gate electrode and a drain electrode and show high performance, have also been being researched and developed actively (Japanese Unexamined Patent Application Publication Nos. 2009-278115 and 2011-228622).

The TFT substrate described in Japanese Unexamined Patent Application Publication No. 2011-228622 will now be described with reference to FIG. 8. The TFT substrate 901 described in the patent document is a top-gate type TFT substrate. The TFT substrate 901 includes a glass substrate 902, an oxide semiconductor layer 903 disposed on the glass substrate 902, and a gate insulating layer 904 and a gate electrode 905 disposed on the channel region 903$b$ located in the center of the oxide semiconductor layer 903. The TFT substrate 901 further includes an aluminum oxide layer 906, an interlayer insulating layer 907, a source electrode 908, and a drain electrode 909. The source electrode 908 is connected to a contact region 903$_{a1}$ of the oxide semiconductor layer 903 through a contact hole CH1. The drain electrode 909 is connected to a contact region 903$_{a2}$ of the oxide semiconductor layer 903 through a contact hole CH2.

The contact regions 903$_{a1}$ and 903$_{a2}$ on both sides of the channel region 903$b$ in the center of the oxide semiconductor layer 903 must have lower resistances than that of the channel region 903$b$. Accordingly, an aluminum layer is formed on the oxide semiconductor layer 903, the gate insulating layer 904, and the gate electrode 905 by sputtering. The aluminum layer is then heat-treated to be oxidized into an aluminum oxide layer 906. On this occasion, the contact regions 903$_{a1}$ and 903$_{a2}$ are doped with aluminum and have reduced resistances compared to the channel region 903$b$. Thus, the TFT substrate 901 has contact regions having a reduced resistance with a relatively simple structure. This aluminum oxide layer 906 also has a moisture barrier property.

SUMMARY

One non-limiting and exemplary embodiment of the present disclosure provides a top-gate type TFT substrate including an oxide semiconductor material, the contact region of which has a reduced resistance and also an enhanced moisture barrier property.

In one general aspect, the techniques disclosed here feature the thin film transistor element substrate of the present disclosure includes a first moisture barrier layer covering the gate insulating layer and the gate electrode, covering the contact regions of the oxide semiconductor layer other than the connecting portion of the contact region connected to the source electrode and the connecting portion of the contact region connected to the drain electrode, and covering an surface of the substrate on which the oxide semiconductor layer is not disposed. The first moisture barrier layer includes a metal oxide and is formed by atomic layer deposition. The first moisture barrier layer formed by atomic layer deposition is in contact with a pair of contact regions.

In the thin film transistor element substrate according to an aspect of the present disclosure includes, the mere formation of the first moisture barrier layer can reduce the resistances of the contact regions of the oxide semiconductor layer being in contact with the first moisture barrier layer. In addition, since this first moisture barrier layer is formed by atomic layer deposition, the layer is highly dense and has a lower water vapor transmission rate than that of a layer formed by sputtering.

Accordingly, in the thin film transistor element substrate provided according to an aspect of the present disclosure, the contact regions have reduced resistances and enhanced moisture barrier properties.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2 is a diagram showing the measurement results of water vapor transmission rates of Example and Comparative Example;

FIG. 4 is a plan view illustrating an organic EL display device according to Embodiment 2;

DETAILED DESCRIPTION

Figure 1:
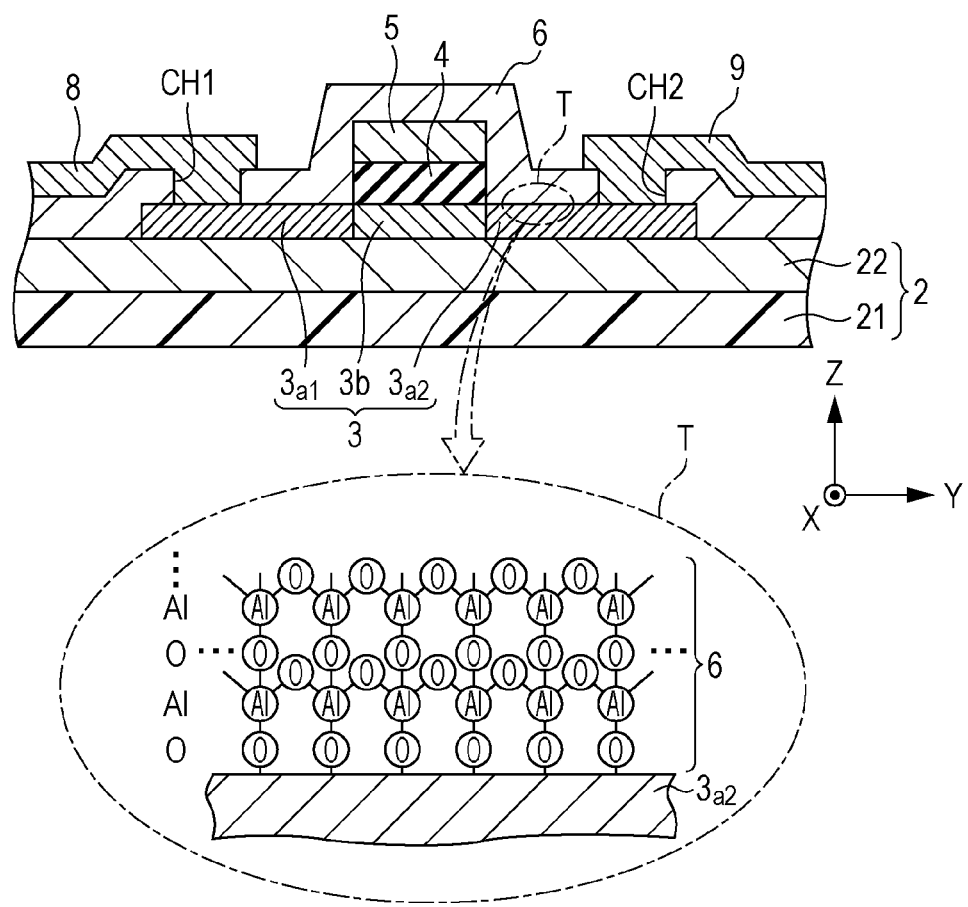
FIG. 1 includes a cross-sectional view of a TFT substrate according to Embodiment 1 and an enlarged view of a main part.

<Underlying Knowledge Forming Basis of the Present Disclosure>

The present inventors have arrived at each aspect according to the present disclosure under the following circumstances: The TFT substrate 901 described in Japanese Unexamined Patent Application Publication No. 2011-228622 includes an aluminum oxide layer 906 and thereby shows a moisture barrier property to some extent. However, since the aluminum oxide layer 906 is formed by forming an aluminum layer by sputtering and then oxidizing the aluminum layer, the aluminum oxide layer 906 is not dense and has a relatively high water vapor transmission rate. The production of various displays by forming liquid crystal display layers or organic EL display layers on TFT substrates 901 has a problem caused by moisture penetrating from the inside and outside of the glass substrate 902 or moisture penetrating along the aluminum oxide layer 906. If the moisture penetrated as described above reaches, for example, a liquid crystal display layer or an organic EL display layer, the moisture causes defects. For example, the organic EL display layer includes a cathode and an electron injection layer, which are deteriorated by moisture. If moisture reaches such a cathode or an electron injection layer, a non-emitting part (dark spot) may occur in the organic EL display layer, or the brightness may be reduced. That is, the aluminum oxide layer 906 has an insufficient moisture barrier property and is demanded to be further improved in the moisture barrier property. Accordingly, the present inventors have arrived at each aspect according to the present disclosure described below based on the findings described above.

The thin film transistor element substrate according to an aspect of the present disclosure includes a substrate; an oxide semiconductor layer that is disposed on a part of the substrate and that has a channel region and a pair of contact regions, each of the pair of contact regions being present on both sides of the channel region along a surface of the substrate; a gate electrode disposed above the channel region with a gate insulating layer interposed between the gate electrode and the channel region; a source electrode connected to one of the pair of contact regions; a drain electrode connected to the other of the pair of contact regions; and a first moisture barrier layer that covers i) the gate insulating layer and the gate electrode, ii) the pair of contact regions of the oxide semiconductor layer other than the first connecting portion of the contact region connected to the source electrode and the second connecting portion of the contact region connected to the drain electrode, and iii) a surface of the substrate on which the oxide semiconductor layer is not disposed. The first moisture barrier layer contains a metal oxide and is formed by atomic layer deposition, and the first moisture barrier layer formed by the atomic layer deposition is in contact with the pair of contact regions.

In this aspect, the first moisture barrier layer covers the gate insulating layer and the gate electrode and covers the pair of constant regions of the oxide semiconductor layer and the substrate in the region on which the oxide semiconductor layer is not disposed. This first moisture barrier layer contains a metal oxide and thereby can reduce the resistances of the contact regions being in contact with the oxide semiconductor layer. That is, the mere formation of the first moisture barrier layer can reduce the resistances of the contact regions of the oxide semiconductor layer being in contact with the first moisture barrier layer. In addition, since this first moisture barrier layer is formed by atomic layer deposition, the layer is highly dense and has a lower water vapor transmission rate compared to a layer formed by sputtering.

Accordingly, in the thin film transistor element substrate provided according to the aspect, the contact regions have reduced resistances and enhanced moisture barrier properties.

In another aspect of the present disclosure, the first moisture barrier layer may have a layer structure at an atomic level. As a result, the first moisture barrier layer can be highly dense and can have a high moisture barrier property. Moreover, the pair of contact regions in contact with the first moisture barrier layer may have lower resistances than that of the channel region not in contact with the first moisture barrier layer.

In another aspect of the present disclosure, the substrate may include a resin substrate mainly made of a resin material and include a second moisture barrier layer disposed on the resin substrate. The second moisture barrier layer may be in contact with the oxide semiconductor layer and the first moisture barrier layer. The moisture barrier property can be further enhanced by thus forming a region where the first moisture barrier layer and the second moisture barrier layer are in direct contact with each other.

In another aspect of the present disclosure, the second moisture barrier layer may be formed by chemical vapor deposition or atomic layer deposition. As a result, the second moisture barrier layer is highly dense compared to a layer formed by sputtering. Furthermore, atomic layer deposition can form a more dense film and can enhance the moisture barrier property.

In another aspect of the present disclosure, the metal oxide included in the first moisture barrier layer may be different from a metal oxide included in the second moisture barrier layer. In such a case, for example, even if a foreign matter is interposed between the resin substrate and the second moisture barrier layer, the first moisture barrier layer is deposited not to reflect the raised portion due to the foreign matter and to cancel the raise of the second moisture barrier layer. As a result, after the formation of the first moisture barrier layer, films having flat surfaces can be formed.

In another aspect of the present disclosure, the first moisture barrier layer may include an oxide of aluminum (Al), and the second moisture barrier layer may include an oxide of zirconium (Zr).

In a method of producing a thin film transistor element substrate according to an aspect of the present disclosure, forming an oxide semiconductor layer on a part of a substrate; forming a gate insulating layer on a channel region of the oxide semiconductor layer formed on the substrate; forming a gate electrode on the gate insulating layer; forming a first moisture barrier layer containing a metal oxide by atomic layer deposition to cover i) a surface of the substrate on which the oxide semiconductor layer is not formed, ii) both sides of the channel region of the oxide semiconductor layer, iii) the gate insulating layer, and iv) the gate electrode, a pair of contact regions being formed on the both sides of the channel region by the metal oxide contained in the first moisture barrier to be doped in the both sides of the channel region; forming a pair of contact holes in the first moisture barrier layer on the pair of contact regions, each of the contact holes penetrating the first moisture barrier layer and reaching each of the pair of contact regions; forming a source electrode on the first moisture barrier layer, the source electrode being connected to one of the pair of contact regions through one of the pair of contact holes; and forming a drain electrode on the first moisture barrier layer, the drain electrode being connected to the other of the pair of contact regions through the other of the pair of contact holes. The pair of contact regions in contact with the first moisture barrier layer have lower resistances than that of the channel region not in contact with the first moisture barrier layer.

According to this aspect, a first moisture barrier layer is formed by atomic layer deposition so as to cover the second moisture barrier layer in the region on which the oxide semiconductor layer is not formed, a pair of second regions on both sides of a first region of the oxide semiconductor layer, the gate insulating layer, and the gate electrode. As a result the first region of the oxide semiconductor layer becomes the channel region, and the pair of second regions becomes a pair of contact regions. The first moisture barrier layer contains a metal oxide. The formation of the first moisture barrier layer by atomic layer deposition causes the doping of the oxide semiconductor layer with the metal in the metal oxide or extraction of oxygen from the oxide semiconductor layer into the first moisture barrier layer, resulting in a reduction in the resistance of the contact region. That is, the mere formation of the first moisture barrier layer can reduce the resistances of the contact regions of the oxide semiconductor layer being in contact with the first moisture barrier layer. In addition, since this first moisture barrier layer is formed by atomic layer deposition, the layer is highly dense and has a lower water vapor transmission rate compared to a layer formed by sputtering. Moreover, the substrate may include a resin substrate mainly made of a resin material and include a second moisture barrier layer on the resin substrate.

Accordingly, the method of producing a thin film transistor element substrate according to this aspect can produce a thin film transistor element substrate including contact regions having reduced resistances and enhanced moisture barrier properties.

In another aspect of the present disclosure, the second moisture barrier layer may be formed by chemical vapor deposition or atomic layer deposition. As a result, the second moisture barrier layer is highly dense compared to a layer formed by sputtering. Furthermore, atomic layer deposition can form a more dense film and can enhance the moisture barrier property.

In another aspect of the present disclosure, the metal oxide included in the first moisture barrier layer may be different from each other a metal oxide included in the second moisture barrier layer. In such a case, for example, even if a foreign matter is interposed between the resin substrate and the second moisture barrier layer, the first moisture barrier layer is deposited not to reflect the raised portion due to the foreign matter and to cancel the raise of the second moisture barrier layer. As a result, a film formed after the formation of the first moisture barrier layer can have a flat surface.

In another aspect of the present disclosure, the first moisture barrier layer may include an oxide of aluminum (Al), and the second moisture barrier layer may include an oxide of zirconium (Zr).

The organic EL display device according to an aspect of the present disclosure includes a thin film transistor element substrate according to an aspect of the present disclosure and an organic EL display layer disposed on the thin film transistor element substrate and at least including an anode, a light emitting layer, and a cathode. As a result, an organic EL display device provided with a thin film transistor element substrate including contact regions having reduced resistances and enhanced moisture barrier properties can be provided.

In another aspect of the present disclosure, an end section of the cathode may be located on an inner side than an end section of the first moisture barrier layer and an end section of the second moisture barrier layer. As a result, the cathode, which is readily deteriorated by moisture, can be located on the inner side than the periphery of the region where the first moisture barrier layer and the second moisture barrier layer are in contact with each other, resulting in an increase in the moisture barrier property of the organic EL display device.

In another aspect of the present disclosure, the organic EL display layer may further includes an electron injection layer. An end section of the electron injection layer is located on an inner side than an end section of the first moisture barrier layer and an end section of the second moisture barrier layer. As a result, the electron injection layer, which is readily deteriorated by moisture, can be located on the inner side than the periphery of the region where the first moisture barrier layer and the second moisture barrier layer are in contact with each other, resulting in an increase in the moisture barrier property of the organic EL display device.

Embodiments for implementing the present disclosure will now be described in detail with reference to the drawings.

Embodiment 1

(Structure of TFT Substrate 1)

A TFT substrate 1 according to Embodiment 1 will be described with reference to FIG. 1. The TFT substrate 1 includes a substrate 2, an oxide semiconductor layer 3 disposed on a part of the substrate 2, and a gate insulating layer 4 and a gate electrode 5 disposed on a channel region $3b$, which is the central portion, of the oxide semiconductor layer 3. The TFT substrate 1 further includes first moisture barrier layer 6 covering the substrate 2 in the region on which the oxide semiconductor layer 3 is not formed, covering the oxide semiconductor layer 3 in contact regions $3_{a1}$ and $3_{a2}$ on which the gate insulating layer 4 is not formed, and covering the gate insulating layer 4 and the gate electrode 5. The TFT substrate 1 further includes a source electrode 8 and a drain electrode 9 on the first moisture barrier layer 6. The first moisture barrier layer 6 is provided with contact holes CH1 and CH2 passing therethrough and reaching the contact regions $3_{a1}$ and $3_{a2}$, respectively, of the oxide semiconductor layer 3. In the contact hole CH1, the source electrode 8 and contact region $3_{a1}$ are connected to each other. In the contact hole CH2, the drain electrode 9 and the contact region $3_{a2}$ are connected to each other. The TFT 1 is a so-called top-gate (staggered structure) type TFT.

The substrate 2 is composed of a resin substrate 21 mainly (for example, more than 50 wt %) made of a resin (hereinafter, referred to as resin substrate 21) and a second moisture barrier layer 22 disposed on the resin substrate 21. Usable examples of the material for the resin substrate 21 include polyimides, polyamides, aramids, polyethylenes, polypropylenes, polyvinylenes, and polyvinylidene chlorides and also include polyethylene terephthalates, polyethylene naphthalates, polycarbonates, polyethylene sulfonic acid, silicone, acrylic resins, epoxy resins, and phenol resins. Two or more of these materials may be mixed. These materials may be chemically modified (chemical modification). These materials may be used alone or in combination to form a resin substrate 21 having a multilayer structure. Examples of the material for the second moisture barrier layer 22 include zirconium oxides ($ZrO_x$) and aluminum oxides ($AlO_x$). The second moisture barrier layer 22 has a function of preventing, for example moisture from permeating through the resin substrate 21 and penetrating above the resin substrate 21. The substrate 2 shown in FIG. 1 has a two-layer structure composed of the resin substrate 21 and the second moisture barrier layer 22 disposed on the resin substrate 21, but the structure of the substrate 2 is not limited thereto. The substrate 2 may be of a single-layer structure of, for example, glass, synthetic silica, or silicon provided with a thermal oxide film. Alternatively, the substrate 2 may have another multilayer structure.

The oxide semiconductor layer 3 is disposed on the second moisture barrier layer 22. The oxide semiconductor layer 3 includes a channel region $3b$ under the gate electrode 5 and the gate insulating layer 4 and contact regions $3_{a1}$ and $3_{a2}$ on both sides of the channel region $3b$. The contact regions $3_{a1}$ and $3_{a2}$ have lower resistances than the channel region $3b$. That is, the contact regions $3_{a1}$ and $3_{a2}$ have higher carrier concentrations than the channel region $3b$. Examples of the material for the oxide semiconductor layer 3 include In—Ga—Zn—O, In—Ti—Zn—O, Zn—O, In—Ga—O, and In—Zn—O. For example, the proportions of the individual elements in In—Ga—Zn—O are shown as $In_xGa_yZn_zO_{1.5x+1.5y+z}$ (x, y, and z each independently represent an integer).

The gate insulating layer 4 is disposed on the channel region $3b$ of the oxide semiconductor layer 3. Examples of the material for the gate insulating layer 4 include $SiO_x$, $SiO_xN_y$, and $TaO_x$. The gate insulating layer 4 is formed in a single-layer or multilayer structure using such an oxide material.

The gate electrode 5 is disposed on the gate insulating layer 4. Examples of the material for the gate electrode 5 include aluminum (Al), molybdenum (Mo), tungsten (W), MoW, copper (Cu), titanium (Ti), and chromium (Cr). The gate electrode 5 is formed in a single-layer or multilayer structure using such a metal material. The gate insulating layer 4 and the gate electrode 5 have side faces in the same planes and are apart from the source electrode 8 and the drain electrode 9. Consequently, the parasitic capacitances between the gate electrode 5 and source electrode 8 and between the gate electrode 5 and drain electrode 9 can be reduced.

The first moisture barrier layer 6 is formed on the second moisture barrier layer 22 in the region on which the oxide semiconductor layer 3 is not formed and also covers the contact regions $3_{a1}$ and $3_2$ of the oxide semiconductor layer 3, the gate insulating layer 4, and the gate electrode 5. The material for the first moisture barrier layer 6 may be a metal oxide. In Embodiment 1, aluminum oxide ($AlO_x$) is used.

The source electrode 8 is disposed on the first moisture barrier layer 6. The source electrode 8 is connected to the contact region $3_{a1}$ of the oxide semiconductor layer 3 through the contact hole CH1. Examples of the material for the source electrode 8 include Al, Mo, W, MoW, Cu, Ti, and Cr. The source electrode 8 is formed in a single-layer or multilayer structure using such a metal material.

The drain electrode 9 is disposed on the first moisture barrier layer 6. The drain electrode 9 is connected to the contact region $3_{a2}$ of the oxide semiconductor layer 3 through the contact hole CH2. Examples of the material for the drain electrode 9 include Al, Mo, W, MoW, Cu, Ti, and Cr. The drain electrode 9 is formed in a single-layer or multilayer structure using such a material.

The first moisture barrier layer 6 before the formation of the contact holes CH1 and CH2 reaching the oxide semiconductor layer 3 covers the entire surfaces of the contact regions $3_{a1}$ and $3_{a2}$ of the oxide semiconductor layer 3. The first moisture barrier layer 6 is made of, for example, $AlO_x$. It is believed that during the formation of the first moisture barrier layer 6, the oxide semiconductor layer 3 being in contact with the first moisture barrier layer 6 is doped with Al from the first moisture barrier layer 6 to form the contact regions $3_{a1}$ and $3_{a2}$, or oxygen is extracted from the oxide semiconductor layer 3 being in contact with the first moisture barrier layer 6 to form the contact regions $3_{a1}$ and $3_{a2}$. The Al-doped or oxygen-extracted contact regions $3_{a1}$ and $3_{a2}$ have reduced resistances than the channel region $3b$. This fact is also supported by experimental results. The phenomenon that the contact region is doped with a metal or that oxygen is extracted from the oxide semiconductor layer is believed to occur also in other metal oxides, in addition to $AlO_x$. As a result, contact regions $3_{a1}$ and $3_{a2}$ have higher carrier concentrations than that of the channel region $3b$ and are provided with appropriate ON/OFF characteristics of TFT.

The first moisture barrier layer 6 has a function of preventing, for example, moisture from permeating through the substrate 2 and penetrating above the substrate 2. $AlO_x$ is generally formed by sputtering. Although this $AlO_x$ formed by sputtering has a certain moisture barrier property, the property is practically insufficient. Accordingly, $AlO_x$ to be used as the first moisture barrier layer 6 is formed by atomic layer deposition (hereinafter, referred to as ALD). As shown in the enlarged view of the region T surrounded with a dashed line in FIG. 1, the film formed by atomic layer deposition has a layer structure at an atomic level. Consequently, the film is highly dense and has a high moisture barrier property. Examples of the metal oxide that can be formed by ALD include $TiO_x$, $CaO_x$, $HfO_x$, $TaO_x$, $LaO_x$, and $YO_x$, in addition to $AlO_x$.

FIG. 2 shows the measurement results of water vapor transmission rates of aluminum oxide single-layer films of a sample formed by ALD in Example and of a sample formed by sputtering in Comparative Example. The measurement was performed by a generally known calcium (Ca) test. In this Ca test, the water vapor transmission rate is calculated from the slope causing a change of Ca from conducting state to non-conducting state by moisture permeated through a film to be measured. As obvious from the measurement results shown in FIG. 2, although the films have similar thicknesses, the sample of Example has a water vapor transmission rate that is about 1000 times lower than that of the sample of Comparative Example. Consequently, the TFT substrate 1 of Embodiment 1 has a very excellent moisture barrier property. The region in which the second moisture barrier layer 22 and the first moisture barrier layer 6 are in direct contact with each other is believed to have a further higher moisture barrier property. Although the second moisture barrier layer 22 may be formed by chemical vapor deposition (hereinafter, referred to as CVD), ALD can form a film being further highly dense and can increase the moisture barrier property.

The oxide constituting the second moisture barrier layer 22 and the oxide constituting the first moisture barrier layer 6 may be the same or different. For example, $ZrO_x$ may be used for the second moisture barrier layer 22, and $AlO_x$ may be used for the first moisture barrier layer 6. If a foreign matter is interposed between the resin substrate 21 and the second moisture barrier layer 22 of the substrate 2, the second moisture barrier layer 22 is deposited with reflecting the foreign matter to cause a protrusion spot. A first moisture barrier layer 6 made of an oxide different from the oxide constituting the second moisture barrier layer 22 is formed on the second moisture barrier layer 22. Consequently, the first moisture barrier layer 6 does not reflect the protrusion due to the foreign matter and is deposited so as to cancel the protrusion of the second moisture barrier layer 22. As a result, the first moisture barrier layer 6 having a flat surface can be formed. The reason of this is presumed that if the oxides constituting the layers are different, the degrees of growth of crystal lattice or the lattice constants are different from each other.

(Process of Producing TFT Substrate 1)

The process of producing a TFT substrate 1 according to Embodiment 1 will be described with reference to FIGS. 3A to 3H.

Figure 3A:
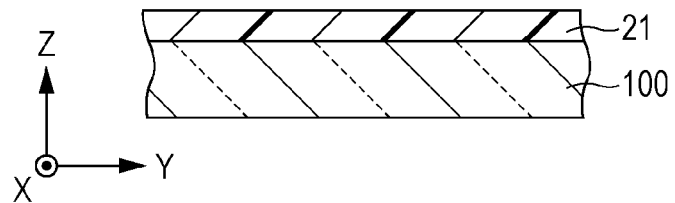
FIG. 3A is a schematic diagram illustrating a process of producing the TFT substrate according to Embodiment 1.

As shown in FIG. 3A, a glass substrate 100 is prepared. The glass substrate 100 is made of, for example, quartz glass, non-alkali glass, or high heat resistant glass. Contamination of the second moisture barrier layer 22 with impurities, such as sodium or phosphorus, contained in a glass substrate is undesirable. Accordingly, an undercoat layer of, for example, $SiN_x$, $SiO_y$, or $SiO_yN_x$ may be formed on the outermost surface (the surface on the side being in contact with the second moisture barrier layer 22) of the glass substrate 100. The undercoat layer may have a thickness of, for example, about 100 to 2000 nm. A polyimide is applied onto the glass substrate 100 by spin coating, followed by heating at 400° C. for 8 hours to give a resin substrate 21 having a thickness of 18 μm. The thickness of the resin substrate may be about 1 to 1000 μm. A thickness of smaller than 1 μm cannot provide a sufficient mechanical strength, whereas a thickness of larger than 1000 μm causes a difficulty in bending and cannot provide a flexible substrate. The resin substrate 21 may be formed by application of an undiluted solution as in spin coating or may be formed by press-bonding of an existing resin substrate. In the press-bonding, an adhesive layer may be formed between the glass substrate 100 and the resin substrate 21, and press-bonding may be then performed. The adhesive layer may be made of any material that provides a desired adhesiveness, such as silicone or acrylic materials.

Figure 3B:
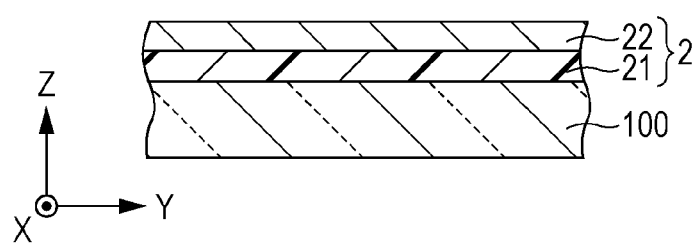
FIG. 3B is a schematic diagram illustrating a process of producing the TFT substrate according to Embodiment 1.

Subsequently, as shown in FIG. 3B, a $ZrO_x$ film serving as the second moisture barrier layer 22 is formed by AIM. A precursor, tetrakis(ethylmethylamino)zirconium, is used such that the $ZrO_x$ film has a thickness of about 60 nm.

Figure 3C:
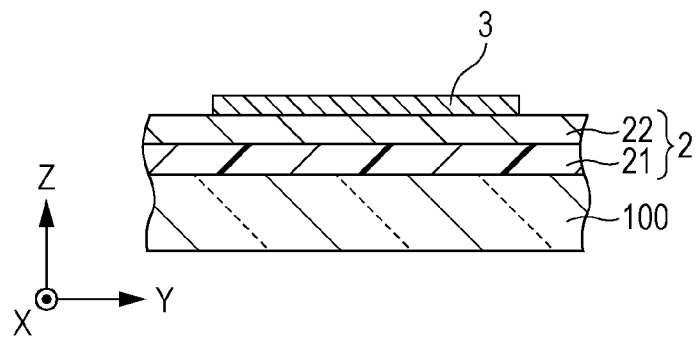
FIG. 3C is a schematic diagram illustrating a process of producing the TFT substrate according to Embodiment 1.

Subsequently, as shown in FIG. 3C, an oxide semiconductor layer 3 having a thickness of about 60 nm is formed by sputtering In—Ga—Zn—O, followed by patterning by photolithography. The oxide semiconductor layer 3 may be formed by laser ablation or CVD, instead of sputtering. The oxide semiconductor layer 3 may have a thickness of about 10 to 300 nm.

Figure 3D:
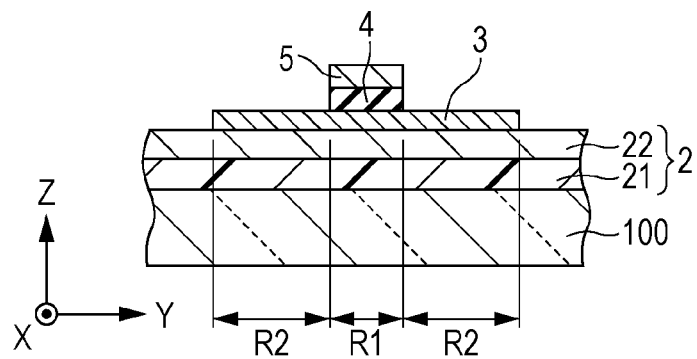
FIG. 3D is a schematic diagram illustrating a process of producing the TFT substrate according to Embodiment 1.

Subsequently, as shown in FIG. 3D, a gate insulating film is formed on the oxide semiconductor layer 3 by CVD of $SiO_x$. The film of $SiO_x$ can be formed by, for example, introducing a silane gas ($SiH_4$) and a nitrous oxide gas ($N_2O$) at a predetermined concentration ratio. The thickness of the $SiO_x$ film is controlled to about 100 nm. The gate insulating film may be made of $SiN_x$, $SiO_xN_y$, or a laminate of layers thereof, instead of $SiO_x$. The gate insulating film may have a thickness of about 50 to 400 nm. A gate electrode film is then formed on the gate insulating film. The gate electrode film may be a MoW film having a thickness of 60 nm. The gate electrode film may have a thickness of about 20 to 100 nm. The gate electrode film is patterned by photolithography. The patterning of the gate electrode film may be a wet etching process using an acetic, phosphoric, and nitric acid solution or a dry etching process using a gas such as a sulfur hexafluoride ($SF_6$) or chlorine ($Cl_2$) gas. The gate insulating film may be patterned by, for example, a dry etching process using a gas such as a sulfur hexafluoride ($SF_6$) gas or a wet etching process using hydrofluoric acid (HF). In FIG. 3D, the gate electrode film is patterned by a wet etching process, and the gate insulating film is then patterned by a dry etching process. As a result, a gate insulating layer 4 and a gate electrode 5 are formed on the first region R1 of the oxide semiconductor layer 3.

Figure 3E:
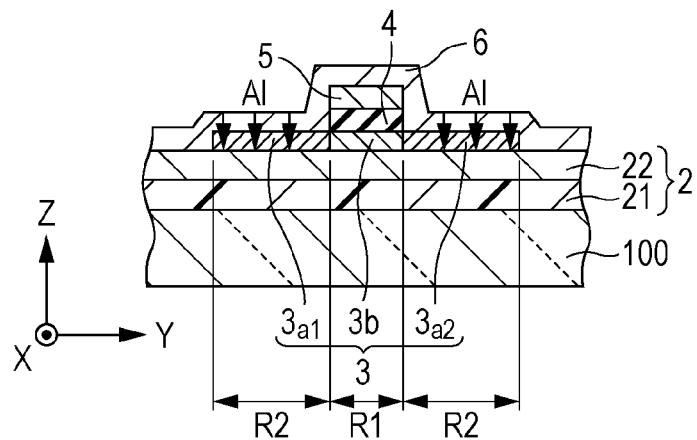
FIG. 3E is a schematic diagram illustrating a process of producing the TFT substrate according to Embodiment 1.

Subsequently, as shown in FIG. 3E, a first moisture barrier layer 6 of an $AlO_x$ film is formed by ALD. Trimethyl aluminum is used as a precursor. The $AlO_x$ film has a thickness of about 30 nm. By the formation of the $AlO_x$ film, a pair of second regions R2's not covered with the gate insulating layer 4 in the oxide semiconductor layer 3 is doped with Al from the $AlO_x$ film, resulting in a reduction in resistance. As a result, in the oxide semiconductor layer 3, a channel region 3b is generated in the first region R1, and contact regions $3_{a1}$ and $3_{a2}$ are generated in the pair of second regions R2's. Furthermore, an inorganic insulating film or an organic insulating film may be formed on the first moisture barrier layer 6. The formation of such a film further reduces the parasitic capacitances between the gate electrode 5 and the source electrode 8 and between the gate electrode 5 and the drain electrode 9. In addition, short-circuiting between electrodes due to a foreign matter can also be prevented. For example, a $SiO_x$ film having a thickness of about 200 nm may be formed by CVD on the first moisture barrier layer 6 of $AlO_x$.

Figure 3F:
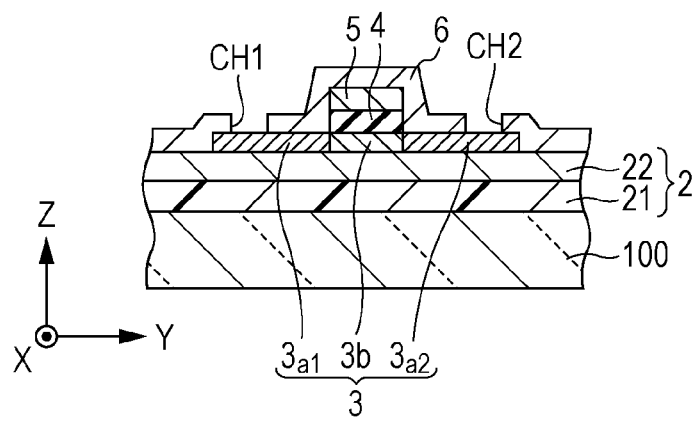
FIG. 3F is a schematic diagram illustrating a process of producing the TFT substrate according to Embodiment 1.

Subsequently, as shown in FIG. 3F, contact holes CH1 and CH2 reaching the contact regions $3_{a1}$ and $3_{a2}$, respectively, are formed by photolithography of the first moisture barrier layer 6 at positions corresponding to the contact regions $3_{a1}$ and $3_{a2}$.

Figure 3G:
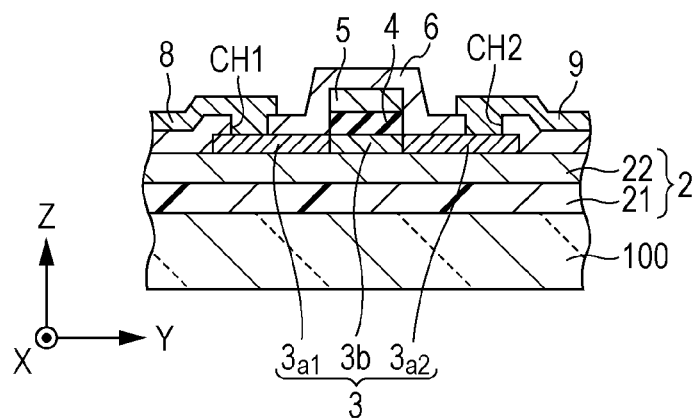
FIG. 3G is a schematic diagram illustrating a process of producing the TFT substrate according to Embodiment 1.

Subsequently, as shown in FIG. 3G, a source electrode film and a drain electrode film are each formed by laminating three films of MoW, Al, and MoW. The source electrode film and the drain electrode film each have a thickness of about 500 nm. The source electrode film and the drain electrode film are then patterned into a source electrode 8 and a drain electrode 9, respectively, by a wet etching process using an acetic, phosphoric, and nitric acid solution.

Figure 3H:
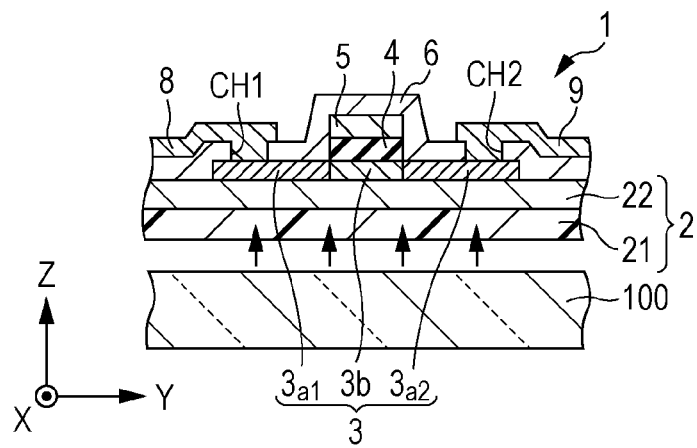
FIG. 3H is a schematic diagram illustrating a process of producing the TFT substrate according to Embodiment 1.

Ultimately, as shown in FIG. 3H, the resulting TFT substrate 1 is peeled from the glass substrate 100. The peeling may be accomplished by irradiation of an excimer laser or solid-state laser from the glass substrate side or by mechanical peeling by a hand or a device from one end of the TFT substrate 1.

Embodiment 2

(Structure of Organic EL Display Device 101)

Figure 5:
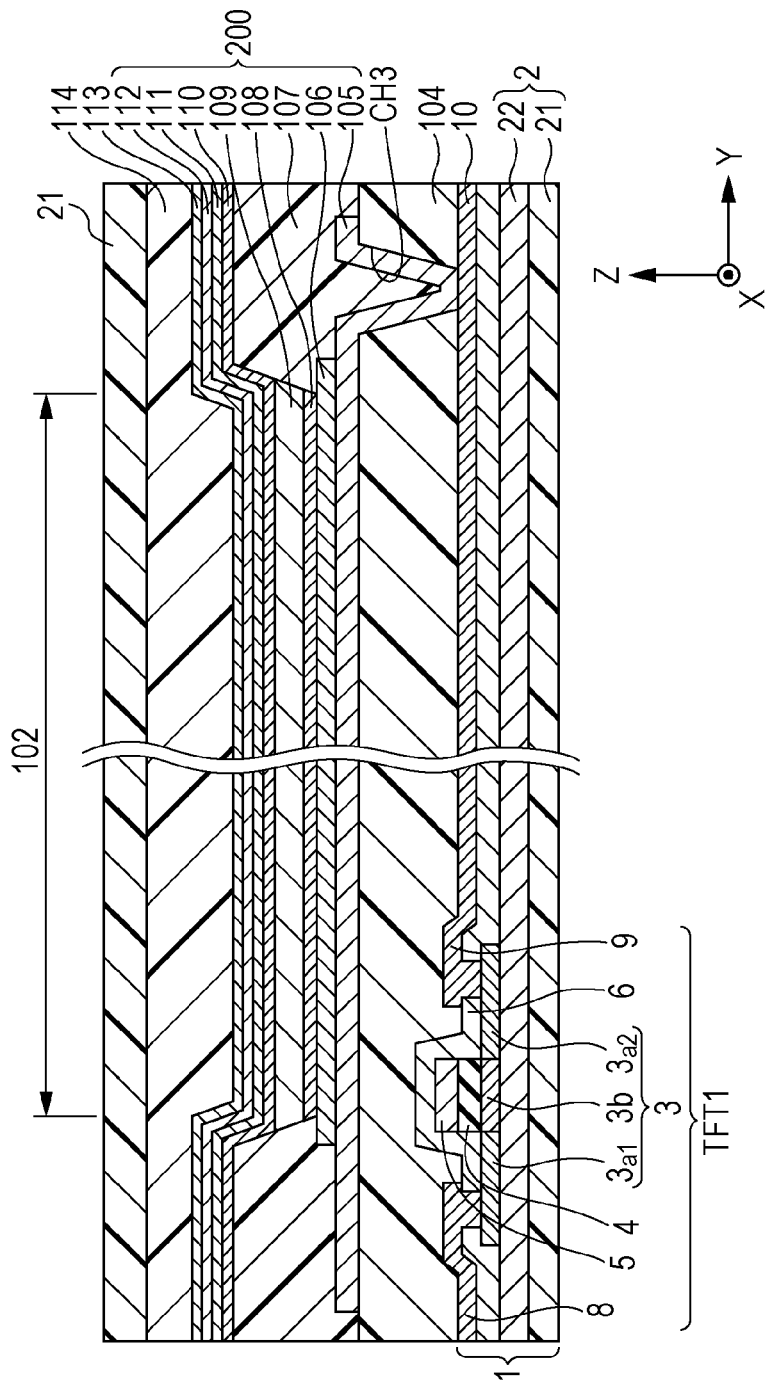
FIG. 5 is a cross-sectional view of the display region of the organic EL display device according to Embodiment 2.
Figure 7:
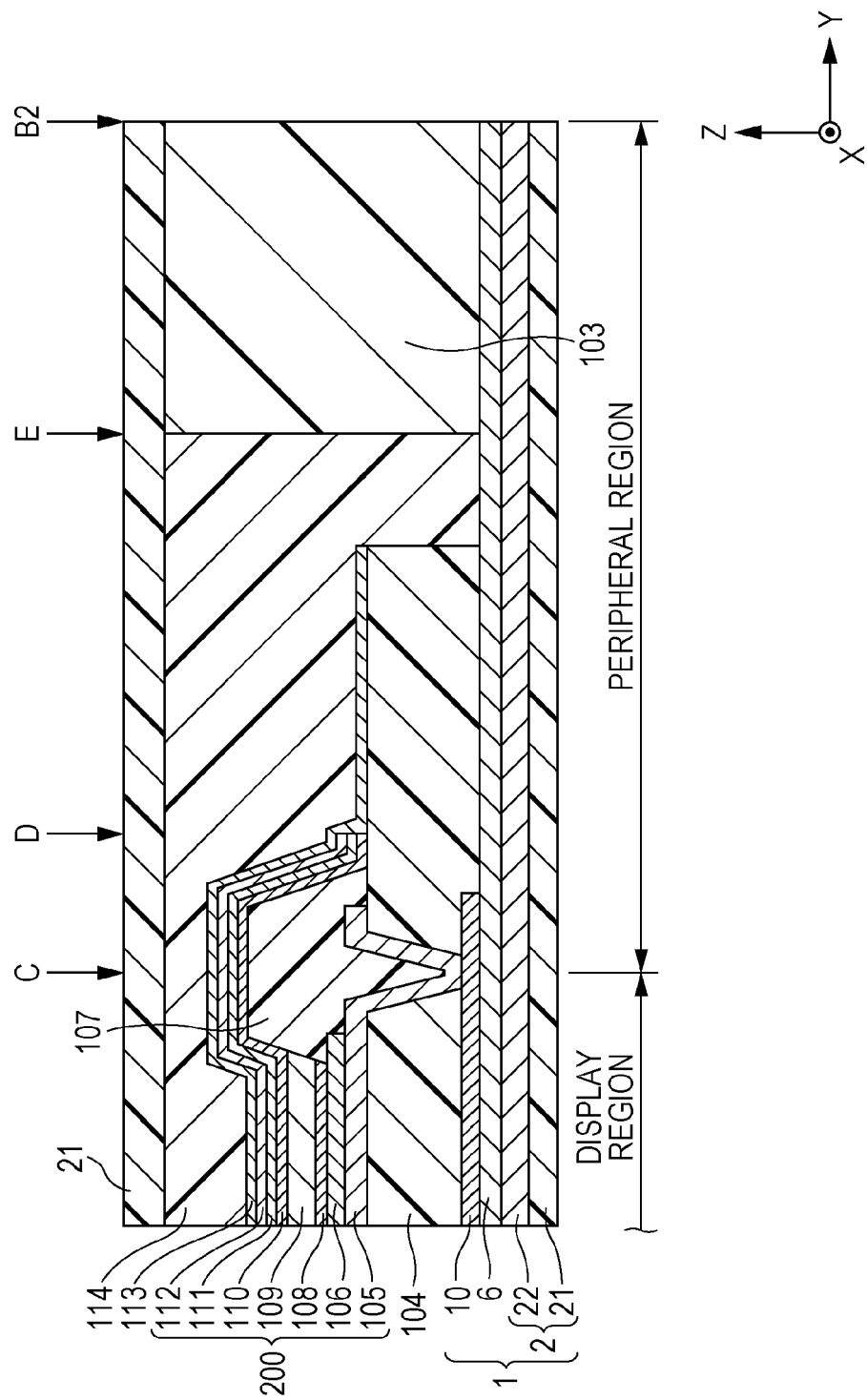
FIG. 7 is a cross-sectional view f a portion spreading from the display region to the peripheral region of the organic EL display device according to Embodiment 2.
Figure 8:
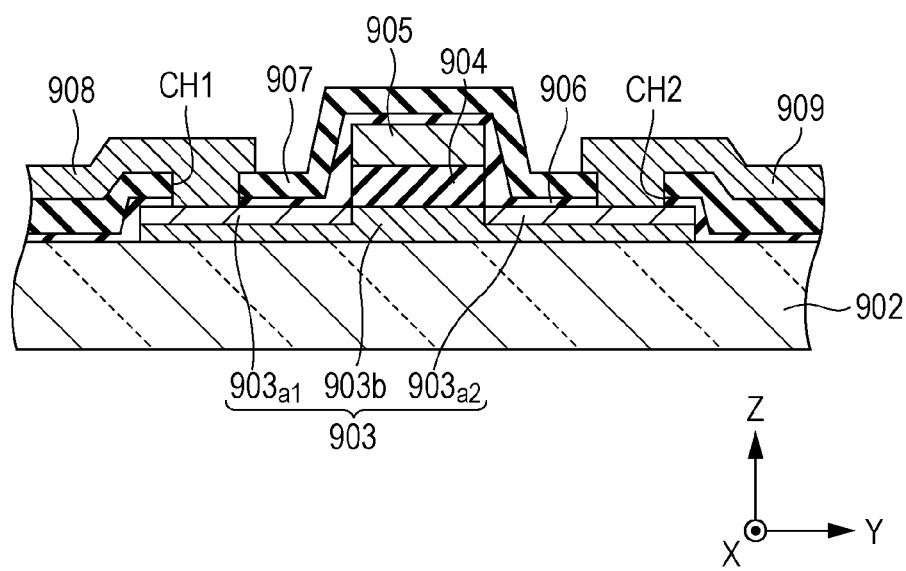
FIG. 8 is a cross-sectional view of a TFT substrate according to a conventional technology.

FIG. 4 is a plan view illustrating an organic EL display device produced using the TFT substrate 1 of Embodiment 1. The organic EL display device 101 is composed of a display region where sub-pixels 102 are arrayed in a matrix and a peripheral region surrounding the periphery of the display region. Furthermore, a sealing member 103 is disposed in the periphery of the peripheral region and prevents the penetration of, for example, moisture and gases from the outside. The sealing member 103 is made of, for example, a dense resin material (e.g., a silicone resin or an acrylic resin) or glass. FIG. 5 is a cross-sectional view taken along the line V-V in the enlarged view S1 of one sub-pixel 102 viewed from the arrow direction. The adjacent sub-pixels 102 are separated from each other with partitions 107 arranged in parallel crosses. FIG. 7 is a cross-sectional view taken along the line VII-VII in the enlarged view S2 of one sub-pixel 102 and the peripheral region adjacent to the sub-pixel 102 viewed from the arrow direction.

Figure 6:
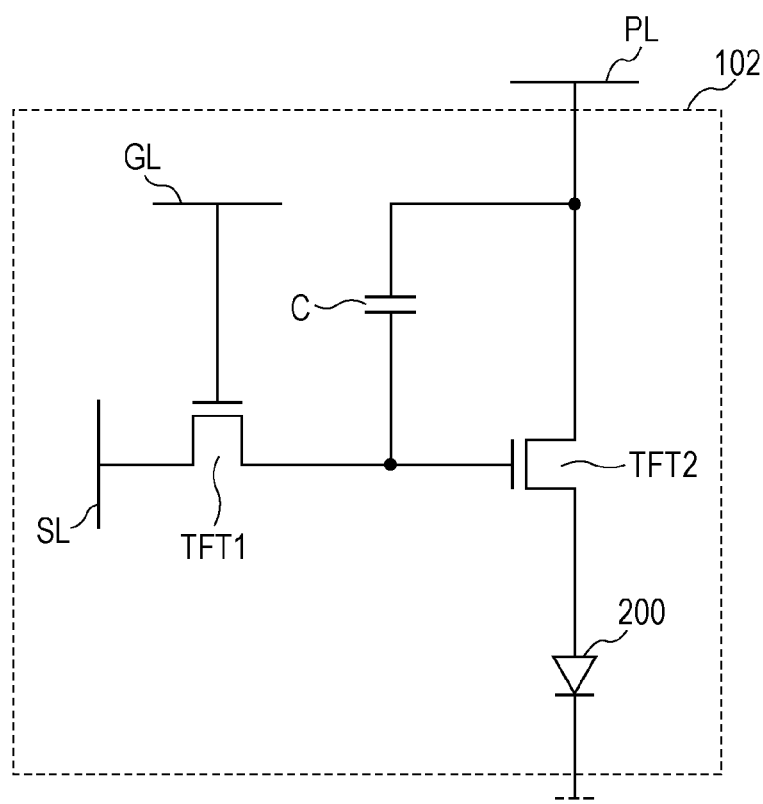
FIG. 6 is a diagram illustrating the circuit configuration of a sub-pixel of the organic EL display device according to Embodiment 2.

As shown in FIG. 5, the organic EL display device 101 includes a TFT substrate 1, a planarizing layer 104, an organic EL display layer 200, a sealing layer 113, a sealing resin 114, and a resin substrate 21, from the bottom in this order. The organic EL display layer 200 includes an anode 105, a hole injection layer 106, a hole-transporting layer 108, a light emitting layer 109, an electron-transporting layer 110, an electron injection layer 111, and a cathode 112, from the bottom in this order. The organic EL display layer 200 also includes the partitions 107 for separating the individual sub-pixels 102. The organic EL display device 101 is of a top-emission type. The TFT substrate 1 shown in FIG. 5 at least includes the TFT substrate 1 described in Embodiment 1 and another TFT 2 (not shown in FIG. 5). FIG. 6 shows the circuit configuration in a sub-pixel 102. TFT 1 is a transistor for switching, and TFT 2 is a transistor for driving. The TFT 1 is connected to the TFT 2 and a capacitor C and is further connected to a source signal line SL and a gate signal line GL, which are connected to a driving circuit (not shown). The TFT 2 is connected to the capacitor C, the TFT 1, the organic EL display layer 200, and a power supply signal line PL for supplying a large current from the outside. The drain electrode 10 of the TFT 2 is connected to the anode 105 of the organic EL display layer 200 in a contact hole CH3 passing through the planarizing layer 104 (see FIG. 5).

Each layer of the organic EL display device 101 will be described in more detail with reference to FIG. 5. The TFT substrate 1 has been already described in Embodiment 1, and the description thereof is omitted.

The planarizing layer 104 insulates the TFT 1, the TFT 2, and each signal line from the anode 105 and planarizes the unevenness due to the TFTs and other components. The planarizing layer 104 is made of, for example, a polyimide resin or acrylic resin. The planarizing layer 104 has a thickness of about several micrometers.

The anode 105 is disposed on the planarizing layer 104. Examples of the material for the anode 105 include metals such as Mo, Al, Au, Ag, and Cu; alloys thereof; organic electrically conductive materials such as PEDOT-PSS; ZnO; and lead-doped indium oxide. A film is formed from such a material by, for example, vacuum deposition, electron-beam deposition, RF sputtering, or printing. The anode 105 may have a light reflection property. The anode 105 is formed for each sub-pixel in a matrix.

A so-called functional layer is disposed on the anode 105. The functional layer shown in FIG. 5 is a laminate composed of a hole injection layer 106, a hole-transporting layer 108, a light emitting layer 109, an electron-transporting layer 110, and an electron injection layer 111 from the bottom in this order. The hole injection layer 106 can be made of, for example, copper phthalocyanine. The hole-transporting layer 108 can be made of, for example, bis[N-(1-naphthyl)-N-phenyl]benzidine (α-NPD). The light emitting layer 109 is made of an organic material. Examples of the organic material include oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, metal complexes of Schiff bases and group Ill metals, oxine metal complexes, and fluorescent materials such as rare earth complexes. The electron-transporting layer 110 can be made of, for example, an oxazole derivative. The electron injection layer 111 can be made of, for example, Alq$_3$. The electron injection layer 111 may be doped with an alkali metal or alkaline earth metal having a low work function, such as Li, Ba, Ca, or Mg, for improving the electron injection efficiency.

A cathode 112 is disposed on the electron injection layer 111. The cathode 112 can be made of, for example, a transparent metal oxide such as indium tin oxide (ITO) or indium zinc oxide (IZO) or an alloy such as Mg—Ag. Mg has a low work function and is suitable for a cathode.

A sealing layer 113 is disposed on the cathode 112. The sealing layer 113 covers and seals the organic EL display layer 200 and prevents the organic EL display layer from being brought into contact with, for example, moisture or air. The sealing layer 113 is made of a transparent material such as SiN$_x$ or SiO$_x$N$_y$.

The sealing resin 114 bonds the TFT substrate 1 provided with the organic EL display layer 200 and other components to a resin substrate 21 opposing to the TFT substrate 1.

The resin substrate 21 has been described in Embodiment 1, and the description thereof is omitted.

The partition 107 is made of an insulating organic material (e.g., an acrylic resin, polyimide resin, or novolac type phenol resin) and is disposed at a position adjacent to the region of the light emitting layer 109. Although the partitions 107 in Embodiment 2 are pixel banks arranged in parallel crosses, the partitions 107 may be line banks arranged in a stripe pattern.

In the organic EL display device 101, the portion spreading from the display region to the peripheral region will be described with reference to FIG. 7. The position indicated by the arrow C is the boundary between the display region and the peripheral region. The position indicated by the arrow D is the end of the region where the electron-transporting layer 110, the electron injection layer 111, and the cathode 112 are laminated. The position indicated by the arrow B2 is the end of the region where the second moisture barrier layer 22 and the first moisture barrier layer 6 are laminated. The sealing member 103 is formed from the position indicated by the arrow E to the position indicated by the arrow B2.

In the organic EL display layer 200, at least one of the electron injection layer 111 and the cathode 112 is readily deteriorated by moisture. As described above, the electron injection layer 111 and the cathode 112 may be made of an alkali metal or alkaline earth metal having a low work function. These metals are active to moisture. For example, in the case of the electron injection layer 111 made of a material containing Ba and the cathode 112 made of ITO, the electron injection layer 111 is readily deteriorated by moisture. Alternatively, in the case of the electron injection layer 111 made of an organic material and the cathode 112 made of a Mg—Ag alloy, the cathode 112 is readily deteriorated by moisture. Accordingly, the electron injection layer 111 and the cathode 112 are preferably disposed on the region showing a high barrier property against moisture transmitted through the resin substrate 21. The region where the second moisture barrier layer 22 and the first moisture barrier layer 6 are in contact with each other has a particularly high moisture barrier property.

Accordingly, when both the electron injection layer 111 and the cathode 112 are readily deteriorated by moisture, the electron injection layer 111 and the cathode 112 are preferably located on the inner side than the end B2 of the region where the second moisture barrier layer 22 and the first moisture barrier layer 6 are in contact with each other. That is, in a planar view of the organic EL display device 101, the electron injection layer 111 and the cathode 112 are preferably located on the inner side than the periphery B2 of the region where the second moisture barrier layer 22 and the first moisture barrier layer 6 are in contact with each other (within the region where the first moisture barrier layer 6 and the second moisture barrier layer 22 are in contact with each other).

When only the electron injection layer 111 is readily deteriorated by moisture, the electron injection layer 111 is preferably located on the inner side than the periphery B2 of the region where the second moisture barrier layer 22 and the first moisture barrier layer 6 are in contact with each other (within the region where the first moisture barrier layer 6 and the second moisture barrier layer 22 are in contact with each other), in a planar view of the organic EL display device 101.

Alternatively, when only the cathode 112 is readily deteriorated by moisture, the cathode 112 is preferably located on the inner side than the periphery B2 of the region where the second moisture barrier layer 22 and the first moisture barrier layer 6 are in contact with each other (within the region where the first moisture barrier layer 6 and the second moisture barrier layer 22 are in contact with each other), in a planar view of the organic EL display device 101.

The structures described above allow the organic EL display device to have a high barrier property against moisture that penetrates from the outside. Since the resin substrate 21 is used in Embodiment 2, a flexible display that is advantageously light, thin, unbreakable, and bendable can be achieved.

<Other Items>

(1) Although Embodiment 2 has described a top-emission type organic EL display device has been described, the present disclosure is not limited thereto and can also be applied to a bottom-emission type organic EL display device.

(2) An example method of producing the organic EL display device in Embodiment 2 is as follows. As described in Embodiment 1, a TFT substrate 1 is formed on a glass substrate 100. Subsequently, without peeling the TFT substrate 1 from the glass substrate 100, a planarizing layer 104, an organic EL display layer 200, a sealing layer 113, and a sealing member 103 are formed on the TFT substrate 1 by a general production process. A resin substrate 21 is then bonded to the TFT substrate 1 provided with each layer and sealing member from the side opposite to the glass substrate 100 side with a sealing resin 114. Ultimately, the glass substrate 100 is peeled to complete a flexible organic EL display device.

(3) The thin film transistor element substrate, the method of producing the substrate, and the organic EL display device including the thin film transistor element substrate according to the present disclosure may be composed of appropriate partial constitution of the embodiments. The materials, numerical values, and other factors described in the embodiments are merely preferable examples and are not intended to limit the scope of the present disclosure. Moreover, it is possible to appropriately modify the constitution within the scope of the technical ideas of the present disclosure. The present disclosure can be widely applied to the whole of the thin film transistor element substrate, the method of producing the substrate, and the organic EL display device including the thin film transistor element substrate.

The thin film transistor element substrate according to the present disclosure can be widely used in display devices of, for example, television sets, personal computers, and mobile phones; solid-state image sensors such as digital cameras; and various types of electronic equipment.

What is claimed is:

1. A method of producing an organic EL display device, comprising:
   forming a thin film transistor element including:
      forming an oxide semiconductor layer above a part of a substrate in a first direction;
      forming a gate insulating layer above a channel region of the oxide semiconductor layer in the first direction;
      forming a gate electrode above the gate insulating layer in the first direction;
      forming a first moisture barrier layer containing a metal oxide by atomic layer deposition to cover and directly contact i) contact regions extending on both sides of the channel region of the oxide semiconductor layer in a second direction orthogonal to the first direction, and ii) the gate electrode;
      forming a first contact hole and a second contact hole in the first moisture barrier layer, each of the first contact hole and the second contact hole penetrating the first moisture barrier layer and reaching the oxide semiconductor layer;
      forming a source electrode above the first moisture barrier layer to directly cover and contact an area of the first moisture barrier layer surrounding the first contact hole and be connected to the oxide semiconductor layer through the first contact hole; and forming a drain electrode above the first moisture barrier layer to directly cover and contact an area of the first moisture barrier layer surrounding the second contact hole and be connected to the oxide semiconductor layer through the second contact hole; and forming an organic EL element above the first moisture barrier layer of the thin film transistor element, the organic EL element including a light emitting layer, a cathode and an anode, wherein:

the substrate includes a second moisture barrier layer, and an end section of the cathode is located closer to the gate electrode than an end section of the first moisture barrier layer and an end section of the second moisture barrier layer.

2. The method according to claim 1, wherein:

the substrate includes a resin substrate mainly made of a resin material and the second moisture barrier layer is above the resin substrate, and the second moisture barrier layer is in contact with the first moisture barrier layer.

3. The method according to claim 2, wherein:

the second moisture barrier layer is formed by one of chemical vapor deposition or atomic layer deposition.

4. The method according to claim 2, wherein:

the metal oxide included in the first moisture barrier layer is different from a metal oxide included in the second moisture barrier layer.

5. The method according to claim 2, wherein:

the first moisture barrier layer includes an oxide of aluminum, and the second moisture barrier layer includes an oxide of zirconium.

6. The method according to claim 1, wherein the contact regions have different electrical resistances from the channel region.

7. A method of producing an organic EL display device comprising:

forming an oxide semiconductor layer above a part of a substrate in a first direction;

forming a gate insulating layer above a channel region of the oxide semiconductor layer in the first direction;

forming a gate electrode above the gate insulating layer in the first direction;

forming a first moisture barrier layer containing a metal oxide by atomic layer deposition to cover and directly contact i) contact regions extending on both sides of the channel region of the oxide semiconductor layer in a second direction orthogonal to the first direction and ii) the gate electrode; and forming an organic EL element above the first moisture barrier layer, the organic EL element including a light emitting layer, a cathode and an anode, wherein:

the substrate includes a second moisture barrier layer, and an end section of the cathode is located closer to the gate electrode than an end section of the first moisture barrier layer and an end section of the second moisture barrier layer.

8. The method according to claim 7, wherein the contact regions have different electrical resistances from the channel region.

* * * * *